United States Patent
Sima

(10) Patent No.: US 12,348,231 B2
(45) Date of Patent: Jul. 1, 2025

(54) DIGITAL LOGIC CONTROLLER

(71) Applicant: EM Microelectronic-Marin SA, Marin (CH)

(72) Inventor: Ovidiu Sima, Zurich (CH)

(73) Assignee: EM Microelectronic-Marin SA, Marin (CH)

( * ) Notice: Subject to any disclaimer, the term of this patent is extended or adjusted under 35 U.S.C. 154(b) by 166 days.

(21) Appl. No.: 18/360,383

(22) Filed: Jul. 27, 2023

(65) Prior Publication Data

US 2024/0120911 A1    Apr. 11, 2024

(30) Foreign Application Priority Data

Oct. 7, 2022 (EP) .................................. 22200383

(51) Int. Cl.
    *H03K 5/15*     (2006.01)
    *H03K 3/037*    (2006.01)
    *H03K 5/159*    (2006.01)
    *H03K 5/24*     (2006.01)

(52) U.S. Cl.
    CPC ............ *H03K 5/159* (2013.01); *H03K 3/037* (2013.01); *H03K 5/249* (2013.01)

(58) Field of Classification Search
    CPC ........ H03K 5/159; H03K 3/037; H03K 5/249; H03K 5/1252; H03K 5/135
    See application file for complete search history.

(56) References Cited

U.S. PATENT DOCUMENTS

| | | | |
|---|---|---|---|
| 2003/0146778 A1 | 8/2003 | McMahan et al. | |
| 2006/0055574 A1* | 3/2006 | Maksimovic | G04F 10/005 341/155 |
| 2006/0103432 A1 | 5/2006 | Rajasekhar et al. | |
| 2011/0311017 A1 | 12/2011 | Baumeister et al. | |
| 2024/0120911 A1* | 4/2024 | Sima | H03K 5/159 |

FOREIGN PATENT DOCUMENTS

WO    WO 2010/112969 A1    10/2010

OTHER PUBLICATIONS

Extended European Search Report issued Mar. 31, 2023 in European Application 22200383.2 filed on Oct. 7, 2022, 10 pages (with Written Opinion).

* cited by examiner

*Primary Examiner* — Quan Tra
(74) *Attorney, Agent, or Firm* — Oblon, McClelland, Maier & Neustadt, L.L.P.

(57) ABSTRACT

A digital logic controller including a first delay cell connectable to a signal input and operable to generate a first time delayed input signal, a second delay cell connectable to the signal input and operable to generate a second time delayed input signal, a counter connectable to the signal input via the first delay cell, two logic units to generate reset signal by one of logic units and to generate set signal by the other of logic units, and connected between the set of delay cells and a flip-flop operable to generate a counter valid signal at a flip-flop output, a first comparator connected to an output of the counter and operable to compare a counter output signal with a first target, a first logic gate connected to the flip-flop output, connected to the first comparator and operable to temporally deactivate processing of the counter output signal.

16 Claims, 2 Drawing Sheets

DIGITAL LOGIC CONTROLLER

CROSS-REFERENCE TO RELATED APPLICATION

This application claims priority to European Patent Application No. 22200383.2 filed on Oct. 7, 2022, the entire disclosure of which is hereby incorporated herein by reference.

FIELD OF THE INVENTION

The present disclosure relates to a digital logic controller.

BACKGROUND OF THE INVENTION

A glitch is a sporadic and unintended switching of an input signal level to a higher or low state, followed by a return to the initial state. The occurrence of glitches in a digital circuit may lead to malfunctioning of the circuit and may cause the circuit to generate a spurious output.

An example of a digital logic controller is e.g. described in document U.S. Pat. No. 10,574,218 B2. This logic controller comprises a first flip-flop and a second flip-flop and further a self-oscillating circuit including an AND gate connected between a first logic gate and a delay cell. Furthermore, there is require a feedback path, wherein a self-oscillating clock signal is inverted and fed-back to an input terminal of the AND gate.

With this or with other logic controller designs a comparatively large number of individual flip-flops is required, which may act as a kind of a noise filter, e.g. at the output of a comparator. Implementation of a large number of flip-flops or of comparable power consuming components compromise a compact design and low power consumption demand for such digital logic controllers.

It is therefore an object of the present invention to reduce the space or area required by logic circuits or logic units in order to enable a rather compact design of a digital logic controller. It is a further aim to power consumption, e.g. static and/or dynamic power consumption of a digital glitch filter, e.g. in order to extend the battery lifetime of mobile electronic devices using such glitch filters.

SUMMARY OF THE INVENTION

The above demands will be solved by a digital logic controller in accordance to the features of the independent claim 1. Further features are subject of the dependent claims.

In one aspect there is provided a digital logic controller. The digital logic controller comprises a first delay cell connectable to a signal input of the digital logic controller. The first delay cell is operable to generate a first time delayed input signal. The digital logic controller further comprises a second delay cell connectable to the signal input through one preceding delay cell and operable to generate a second time delayed input signal. The digital logic controller further comprises a third delay cell connectable to the signal input through two preceding delay cells and operable to generate a third time delayed input signal. The digital logic controller further comprises a fourth delay cell connectable to the signal input through three preceding delay cells and operable to generate a fourth time delayed input signal.

A set of delay cells are all connected in series and connectable to a signal input in input of a first delay cell.

The digital logic controller further comprises a counter connectable to the signal input via the first delay cell and the second delay cell. In other words, the counter is connectable or is connected to an output of the second delay cell in order to receive the first and second time delayed input signal.

The digital logic controller further comprises at least a first comparator connected to an output of the counter and operable to compare a counter output signal with a first target, e.g. a predefined logic target.

The digital logic controller also comprises a flip-flop connected to two logic units able to generate the set and reset signals. The flip-flop is operable to generate a counter valid signal at a flip-flop output. Typically, the flip-flop toggles between a logical zero and a logical one. Here, a logical one is equivalent to the generation of the counter valid signal. A logical zero is equivalent to the suppression or disabled generation of such a counter valid signal. The digital logic controller further comprises a first logic gate connected to the flip-flop output and connected to the first comparator. The first logic gate is operable to temporally deactivate processing of the counter output signal.

The digital logic controller is typically to be connected to a clock source operable to provide or to generate an alternating clock signal as the input signal. By way of the first comparator and the first logic gate as well as by way of first and second delay cells and/or the flip-flop there can be provided a temporary deactivation of processing of counter output signals particularly during those time intervals in which the counter changes its counter state.

With some examples and by way of the first delay cell the counter can be exclusively driven or triggered by the second time delayed input signal. The original input signal and the first time delayed input signal can be used to trigger the flip-flop to deactivate the counter valid signal at the flip-flop output. Deactivation of the counter valid signal, i.e. switching the flip-flop output to a logical zero may then be used to deactivate operation of the comparator and/or to deactivate processing of the counter output signal.

By way of the third delay cell and the fourth delay cell, the temporal deactivation of processing, the counter output signal can be abrogated and the comparator and/or comparator output signal processing can be switched into a normal processing mode. Typically, the comparator output signal is provided as a signal output of the digital logic controller.

With some examples, the logic block is located between the flip-flop output and the first comparator. Depending on the flip-flop output, the logic block may be operable to disable the first comparator. Hence, when the flip-flop output is at a logical zero the first logic gate may deactivate operation of the first comparator so as to prevent the first comparator to conduct the comparison between the counter output signal with the first target. When the flip-flop output is at a logical one the first logic gate may activate operation of the first comparator so as to initiate or enable the first comparator to conduct the comparison between the counter output signal with the first target.

With other examples the first logic block is connected to the flip-flop output and is further connected to an output of the first comparator. The first logic block may be implemented as a logic AND gate and may switch to a logic one only when the output of the first comparator is high and when the flip-flop output is high, hence when the counter valid signal is provided after flip-flop output. Here, the first logic gate acts as a kind of a filter that can be switched on and off to conduct or to pass through the comparator output to the signal output of the digital logic controller.

The first logic block is controllable by the flip-flop output. The flip-flop output may toggle between the counter valid signal or logical one, also denoted as a set signal, and a logical zero, also denoted as a reset signal. Since the flip-flop is indirectly connected to the first and the fourth delay cells, and since the switching of the counter is governed by rising or falling edges of the input signal, the flip-flop output can be used to temporally deactivate the processing of the counter output signal such that during a predefined time interval around a counter operation or counter processing, the counter output signal or its further processing is at least temporally suppressed. In this way, the digital logic controller is temporally switchable into a suppressing mode especially during and/or for such time intervals in which generation of glitches can be expected.

The digital logic controller is of particular advantage since it requires only one flip-flop. Insofar, and compared to prior art solutions with the present digital logic controller the total number of flip-flops required for implementation of the digital logic controller can be reduced to a minimum thus allowing to reduce construction space and power consumption of the digital glitch filter.

According to further examples the flip-flop together with set and reset logic units is operable to suppress or to deactivate processing of the counter output signal at a predefined time interval before the counter conducts or executes a counting operation.

Accordingly, by way of set and reset logic units and the flip-flop, the processing of the counter output signal can be activated at a predefined time interval after the counter has executed a respective counting operation.

According to a further example the first logic block or gate comprises a first gate input, a second gate input and a gate output. The first gate input is connected to the flip-flop output. The second gate input is connected to an output of the first comparator. The first gate is operable to provide a filtered output signal at the gate output. Typically, the gate output is connected or is connectable to a processing unit, which receives the filtered output signal as an input signal for further processing.

With some examples the first logic gate comprises an AND gate. With other examples, the first logic gate comprises a multiplexer. The first logic gate is operable to selectively enable or disable the output of the first comparator.

With the implementation of the first logic block as an AND gate downstream of the flip-flop and downstream of the first comparator, the first comparator can be directly connected to the output of the counter. Signals generated by the counter and being optionally subject to glitches may affect the operation of the comparator accordingly but since the output of the comparator is filtered by the first logic gate, e.g. implemented as an AND gat, such glitches have no effect on the filtered output signals because the AND gate is operable to suppress any output signal provided by the comparator as long as the flip-flop output provides a reset signal and hence as long as the generation of a counter valid signal is disabled.

Implementation of the first logic gate in form of an AND gate is rather space saving and allows to reduce electric power consumption.

According to a further example the digital logic controller further comprises a second comparator connected to the output of the counter and operable to compare the counter output signal with a second target. The digital logic controller further comprises a second logic gate connected to the flip-flop output and connected to the second comparator. The second logic gate is operable to temporally deactivate processing of the counter output signal.

Typically, the first target and the second target art different targets. They distinguish from each other by predefined target values. The first target may represent a first value of the counter. The second target may represent a second value of the counter.

Typically, the input of the second comparator is parallel to the input of the first comparator. More typically, the input of the second logic block is parallel to the input of the first logic block. Insofar, the arrangement of the second comparator and the second logic block is effectively parallel to the arrangement of the first comparator and the first logic block.

Insofar, all effects and examples as described above with respect to the first logic block and to the first comparator equally apply to the logic block and the second comparator, mutatis mutandis.

With some examples, the arrangement of the first comparator and the first logic block represents a first output terminal of the digital logic controller. The arrangement of the second comparator and the second logic block represents a second output terminal of the digital logic controller.

With some examples the digital logic controller comprises numerous output channels each of which comprising a comparator and a logic block as described above in connection with the first comparator and the first logic block and/or as described above in connection with the second comparator and the second logic block.

With some examples the digital logic controller comprises a number n of comparators and associated logic blocks, wherein n is an integer number larger than 2. All comparator-logic block arrangements as described above, e.g. in connection with the first comparator and the first logic block are typically arranged in parallel so as to provide a respective number of parallel output channels of the digital logic controller.

According to a further example, an input of the second delay cell is connected to an output of the first delay cell. Accordingly, the second delay cell is operable to generate a further delay onto the first time delayed input signal. Hence, the second time delayed input signal is provided with a larger time delay than the first time delayed input signal compared to the original input signal.

Alternative to the serial arrangement of first and second delay cells, it is also conceivable that the second delay cell is directly connected to the input signal, wherein the second time delayed input signal is provided with a larger temporal delay than the first time delayed input signal.

With the second delay cell being connected to an output of the first delay cell the first and second delay cells may be implemented in a likewise or even identical manner. Here, one and the same delay cell e.g. providing one and the same time delay, may be used as first and second delay cells, respectively. In this way, the number of identical components used for implementing the digital logic controller can be increased thus allowing to reduce manufacturing costs for the digital logic controller.

According to a further example, an input of the counter is connected to the output of the second delay cell. This way, the input of the counter is exclusively provided with the second time delayed input signal as provided by the second delay cell.

Hence, the operation of the counter is temporarily delayed compared to the input signal or clock signal as provided at the signal input. The temporal delay of the counter provides a disabling or deactivating processing of the counter output signal, especially before the counter conducts a counting operation, which in turn may give rise to the generation of glitches. By making use of a first and a second delay cells preceding the input of the counter the switching behavior and hence the timing of the switching or counting operations of the counter can be further temporally delayed compared to the original input signal. Such a further term delay for the operation of the counter is beneficial to complete a temporal deactivation of the processing of the counter output signal and/or to have enough time for the flip-flop to switch from a set signal to a reset signal and/or to disable generation of the counter valid signal.

According to a further example, the digital logic controller comprises a first logic unit connected to the first delay cell and connected to the flip-flop. The first logic unit may be operable to disable generation of the counter valid signal at the flip-flop output. With some examples the logic unit is operable to generate a pulse at an input of the flip-flop. Upon receiving of such a pulse or signal from the first logic unit the flip-flop output may toggle or may switch into another state. Here, the flip-flop output may switch from a set signal, hence a counter valid signal to a reset signal, and hence to a logical zero.

The first logic unit may comprise a first and a second input, one of which being connected to the first delay cell and being hence provided with a first time delayed input signal. The other input may be directly connected to the signal input. This way, a falling edge or a rising edge of the input signal can be easily detected and can be used to trigger switching of the flip-flop output e.g. from a set signal to a reset signal and/or or vice versa.

According to a further example, the first logic unit is operable to reset an output of the flip-flop. With some examples, the first logic unit comprises an AND gate with a first gate input and a second gate input. The first gate input is connected to the signal input. The second gate input is connected to an output of the first delay cell. One of the first gate input and the second gate input of the first logic unit is an inverted input. This way, the first logic unit is operable to generate a pulse or is operable to generate a high signal every time a rising or falling edge of the input signal passes through the first delay cell.

Typically, the first gate input connected to the signal input is also connected to the input of the first delay cell and the second gate input is connected to the output of the first delay cell. Hence, as a rising or falling edge of the input signal is present at the gate input the first and the second gate inputs are provided with different low and high signal for the duration of the time delay imposed by the first delay cell. Only during this time interval or time delay as provided by the first delay cell, the output of the first logic unit is at a high level. In all other cases, namely when the first gate input and the second gate input are at the same signal level the output of the first logic unit is a logical zero due to the fact that one of the first gate input and the second gate input is an inverted input.

According to a further example the digital logic controller comprises a fourth delay cell connected to an output of the second delay cell and operable to generate a fourth time delayed input signal. The fourth delay cell may be connected in series with the second delay cell. Hence, an output of the second delay cell may be connected to an input of the fourth delay cell.

With some examples, the digital logic controller comprises a first delay cell, a second delay cell, a third delay cell and a fourth delay cell. The delay cells may be arranged in series. Here, the first delay cell may be connected to the signal input. The second delay cell is connected to output of the first delay cell and the output of the second delay cell is connected to the input of the third delay cell, and the output of the third delay cell is connected to the input of the fourth delay cell.

With third and fourth delay cells a well-defined switching or coupling of the flip-flop can be provided, e.g. to generate a counter valid signal and to set the flip-flop output to a high value.

With a further example, the digital logic controller also comprises a second logic unit connected to the second delay cell and connected to the flip-flop. The second logic unit may be operable to enable generation of the counter valid signal at the flip-flop output. Hence, the second logic unit may be operable to set and output of the flip-flop. Typically, and by way of the third and fourth delay cells the re-activation of the processing of the counter output signal can be controlled at a well-defined time interval after a counter action has been conducted by the counter.

By making use of the third and the fourth delay cells there can be provided a pulse being indicative of a rising or falling edge of the input signal or delayed input signal, which pulse can be used to change the flip-flop output.

According to a further example the second logic unit comprises an AND gate with a first gate input and a second gate input. The first gate input is connected to an output of the second delay cell. The second gate input is connected to an output of the fourth delay cell. One of the first gate input and the second gate input of the second logic unit is an inverted input. With some examples the second logic unit may be implemented similar or identical to the first logic unit. In principle, identical logic units can be used to implement the first and the second logic units. The first gate input of the second logic unit may be connected to the input of the fourth delay cell and the second gate input may be connected to the output of the fourth delay cell. With some examples, wherein the input of the fourth delay cell is connected to the output of the second delay cell the first gate input is automatically connected to the input of the fourth delay cell.

With one inverted input at the first gate input or at the second gate input and by implementing the second logic unit as an AND gate there can be provided a rather space saving and cost-efficient implementation for the digital logic controller, which only consumes a minimum of electric energy.

According to a further example the digital logic controller is equipped with a clock source connected to the signal input. With other examples the digital logic controller is connectable to an external clock source that is connectable to the signal input. Typically, the input signal provided at the signal input is a clock signal.

According to a further example the counter and the flip-flop of the digital logic controller are operable to change a logic state with a falling edge of the input signal. With other examples the counter and the flip-flop are operable to change a logic state with a rising edge of the input signal.

According to another example generation of the counter valid signal at the flip-flop output, hence generation of a set signal is disabled with a falling edge of the input signal while the first time delayed input signal is high. In this way and with a falling edge of the input signal the processing of the counter output signal can be deactivated by switching the flip-flop output into a low state. Here, the falling edge of the input signal also triggers a counter operation. Due to the first delay cell and optionally due to the third delay cell the toggling of the flip-flop precedes the counting operation of the counter. This way it is guaranteed that during the counter changing its output value processing of the counter output signal is effectively and temporally deactivated or suppressed.

According to a further example the counter valid signal and hence the signal at the flip-flop output is generated or set to logic one with a falling edge of the fourth time delayed input signal. Here, the temporal delay imposed by the second and by the fourth delay cells is larger than the time required by the counter to change from one counting state to another counting state. Hence, by using the falling edge of the fourth time delayed input signal for generating an enabling pulse operable to toggle the flip-flop output to a logic one it can be guaranteed that processing of the counter output signal will be activated or reactivated at a well-defined time after completion of the change of the counting state of the counter.

With a further example the flip-flop output is set to a logic one and hence provides the counter valid signal when a pulse is generated by the first logic unit, i.e. when the second time delayed input signal is a logic zero and when the fourth time delayed input signal is at a logical one. Here, the output of the flip flop can be reset and hence generation of the counter valid signal can be disabled with a falling edge of the input signal.

With other examples it is also possible that the counter and the flip-flop are operable to change a logic state with a rising edge of the input signal. With such examples generation of the counter valid signal at the flip-flop output is enabled or triggered with a rising edge at the fourth time delayed input signal. Furthermore, generation of the counter valid signal at the flip-flop output may be disabled with a pulse generated when the first time delayed input signal is high and when the input signal is low.

With further examples generation of the counter valid signal at the flip-flop output may be provided by a pulse of the second logic unit, which is generated when the second delayed input signal is equal to logic one and when the fourth time delayed input signal is at logic zero. Here, the generation of the counter valid signal may be disabled and hence, the flip-flop output may be reset with a rising edge of the input signal.

BRIEF DESCRIPTION OF THE DRAWINGS

In the following, an example of a digital logic controller is illustrated in greater detail by making reference to the drawings, in which.

DETAILED DESCRIPTION

Figure 1:
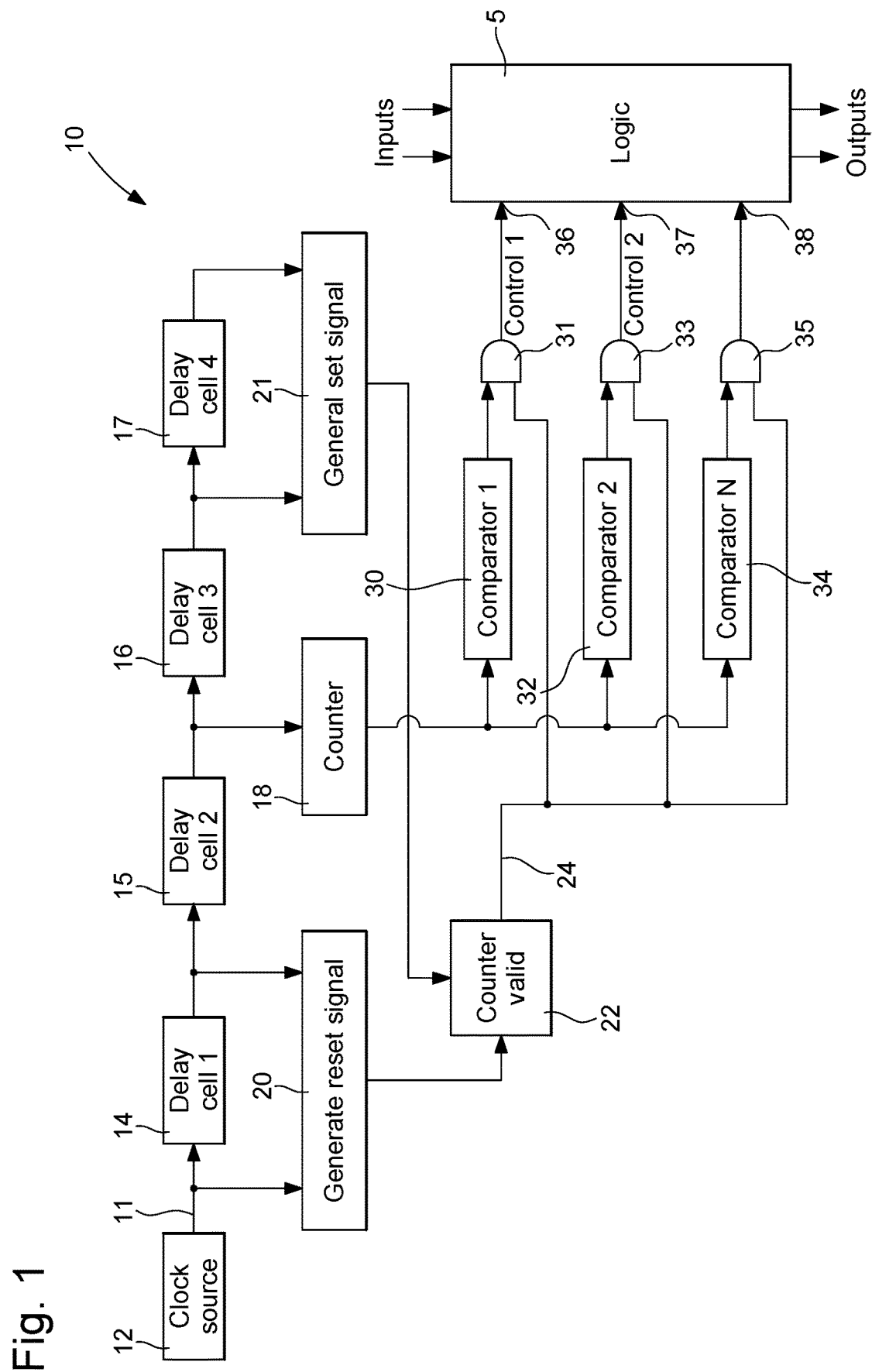
FIG. 1 schematically illustrated a block diagram of an example of the digital logic controller.

FIG. 1 is an example of a digital logic controller 10. The digital logic controller 10 comprises a signal input 11 connectable or connected to an internal or external clock source 12. The digital logic controller 10 further comprises at least a first signal output 36 and a second signal output 37 and optional further signal outputs 38 each of which being e.g. connected or being connectable to a processing unit 5 for further signal processing of the filtered signals provided at each signal output 36, 37, 38.

The digital logic controller 10 comprises a counter 18, which is driven by the input signal as provided by the clock source 12. The input of the counter 18 is not directly connected to the signal input 11. There are provided at least a first delay cell 14 and a second delay cell 15. There may be provided further delay cells, e.g. a third delay cell 16 and a fourth delay cell 17.

With the present example the numerous delay cells 14, 15, 16, 17 are arranged in series. Hence, an input of the first delay cell 14 is connected to the signal input 11. An output of the first delay cell 14 is connected to an input of the second delay cell 15. An output of the second delay cell 15 is connected to an input of the third delay cell 16. An output of the third delay cell 16 is connected to an input of the fourth delay cell 17.

Figure 2:
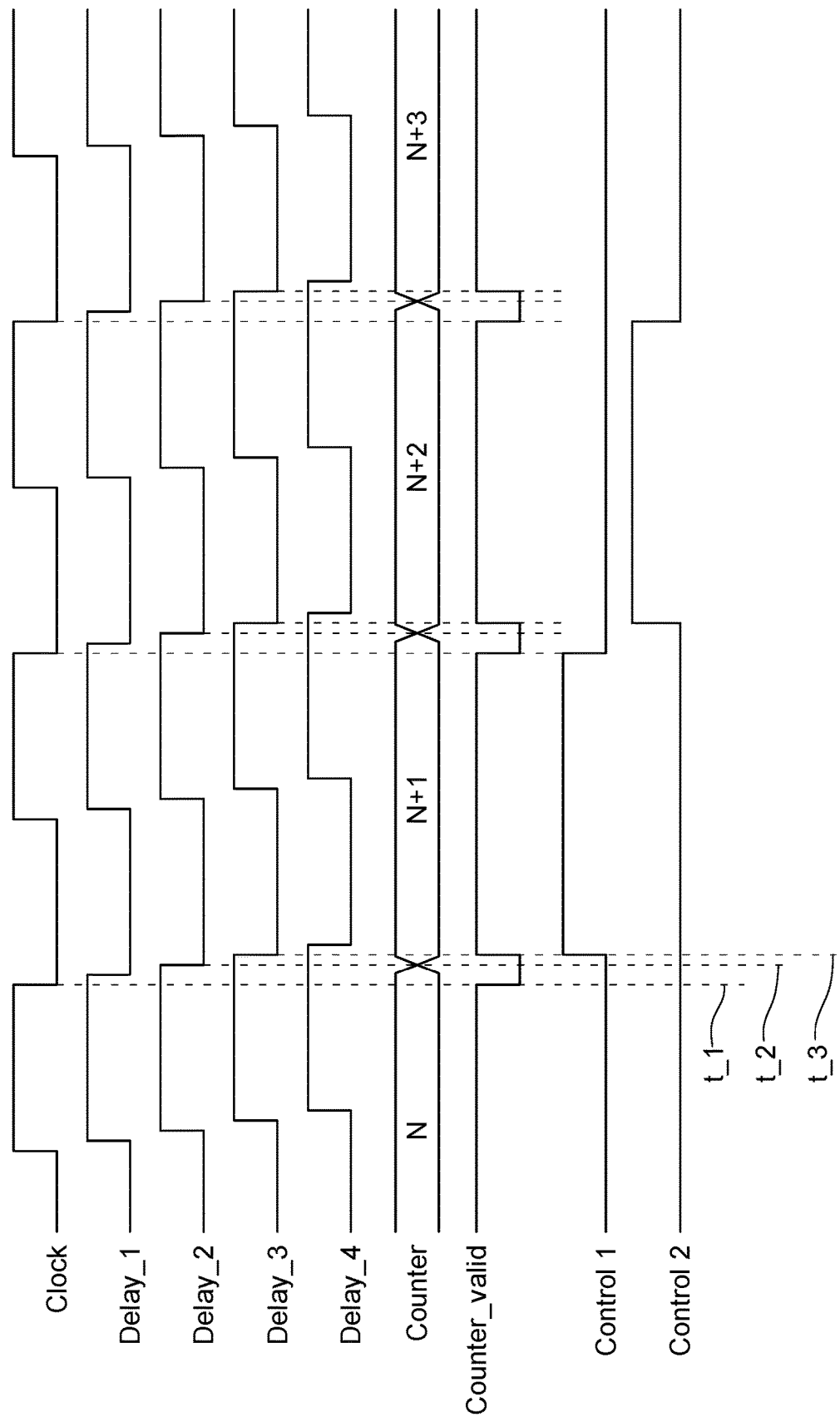
FIG. 2 shows a timing diagram of the digital logic controller according to FIG. 1.

The counter 18 is connected to the output of the second delay cell 15. The first delay cell 14 is operable to generate a first time delayed input signal. The second delay cell 15 is operable to generate a second time delayed input signal. The third delay cell 16 is operable to generate a third time delayed input signal and the fourth delay cell 17 is operable to generate a fourth time delayed input signal. The respective time delayed input signals are also illustrated in the timing diagram of FIG. 2 as delay_1, delay_2, delay_3 and delay_4.

As it is apparent from the illustration the first time delayed input signal delay_1 follows the input signal. The second time delayed input signal delay_2 provides a further temporal offset to the first time delayed input signal delay_1. The third time delayed input signal delay_3 has a further temporal offset compared to the second time delayed input signal delay_2 and the fourth time delayed input signal delay_4 has a further time delay with respect to the third time delayed input signal delay_3.

The digital logic controller 10 further comprises a flip-flop 22 and at least a first comparator 30. The first comparator 30 is connected to an output of the counter 18. Typically, the digital logic controller 10 comprises a number of comparators, e.g. a second comparator 32 and a third comparator 34. Here, the third comparator 34 may represent a large number n of further comparators each of which being connected with a logic block 31, 33, 35. As illustrated, an output of the first comparator 30 is connected to first block input of a first logic block 31.

The first logic block 31 is implemented as a AND gate. A gate output of the first logic block 31 is implemented as a first signal output 36. In the same manner the second comparator 32, which is arranged in parallel compared to the first comparator 30 also has an output connected to a first gate input of a second logic gate 32. Also, the second logic block 33 is implemented as a logic AND gate. A gate output of the second logic block 33 is provided as a signal output 37 and represents a second output channel connected to or connectable to the processing unit 5.

Likewise, the third or n comparator(s) 34 comprises an output connected to a first gate input of a third or n logic block(s) 35. The gate output of the third or n logic block(s) 35 is provided as a third or n output(s) 38 and thus represent a third or n output channel(s) of the digital logic controller 10, with n being an integer number larger than 2.

The second block input of the first logic block 31, of the second logic block 33 and of the third or n-th logic block(s) 35 are all connected in series and are connected to a flip-flop output 24 of the flip-flop 22. By way of the flip-flop 22 the respective second gate inputs of the numerous logic blocks 31, 33, 35 can be set to a digital zero and hence into a low level thereby effectively deactivating the signal output 36, 37, 38.

The digital logic controller 10 comprises a first logic unit 20 and a second logic unit 21. The first logic unit 20 is operable to reset the state of the flip-flop 22. The second logic unit 21 is operable to set the state of the flip-flop 22. When the flip-flop 22 receives an input signal from the first logic unit 20, it is operable to deactivate generation of a counter valid signal at the flip-flop output 24. When the flip-flop 22 receives an input signal from the second logic unit 21, it is operable to generate a counter valid signal at the flip-flop output 24.

Generation of such of a logic one at the flip-flop output 24 somehow activates the first, the second and the third or AND logic blocks 31, 33, 35 so as to pass through an output signal of the respective first, second, third or n comparators 30, 32, 34 to the respective signal outputs 36, 37, 38.

With the presently illustrated example the first logic unit 20 comprises an AND gate with a first gate input and a second gate input. Here, the first gate input is connected to the signal input 11. The second gate input is connected to an output of the first delay cell 14. With the presently illustrated example one of the first gate input and the second gate input of the first logic unit 20 is an inverted input.

The second logic unit 21 is implemented in a likewise manner. Also, the second logic unit 21 comprises an AND gate with a first gate input and a second gate input, wherein one of the first and the second gate inputs is implemented as an inverted input. Here, the first gate input is connected to the output of the second delay cell 16. The second gate input is connected to an output of the fourth delay cell 17.

Operation of the digital logic controller is now illustrated in greater detail by making reference to the timing diagram. The clock signal "clock" regularly alternates between a logic zero and a logic one. With a falling edge at time t_1 the first input of the first logic unit 20 switches to a logic zero. Due to the time delay between the first input and the second input of the first logic unit 20 as provided by the first delay cell 14 the first logic unit 20 starts to generate a respective pulse with a pulse duration that corresponds to the delay as provided by the first delay cell 14.

In response to receive the high signal or pulse from the first logic unit 20 the flip-flop 22 toggles and generates a low signal level at the flip-flop output 24 which is represented by a switching of the counter valid signal to a logic zero in the timing diagram.

At the falling edge of the first third delayed signal delay_3, hence at t_2 the counter switches its state from N to N+1. Thereafter and after the falling edge of the second delay cell 16 at time t_3 a pulse will be generated by the second logic unit 21 with a pulse duration that corresponds to the time delay of the fourth delay cell 17.

Generation of a respective pulse by the second logic unit 21 is transferred to the respective input of the flip-flop 22, which in response changes its state into a logic one at the flip-flop output 24 and hence reactivated generation of the counter valid signal.

In other words and between the time t_1 and t_3 as depicted in the timing diagram the flip-flop output 24 is set to a logic zero thereby disabling or suppressing any output at the first, second, third or n logic gates 31, 33, 35.

In the present example the first signal output 36 is represented as a control_1 and the second signal output 37 is represented in the timing diagram as control_2. With the presently illustrated example, the first comparator 30 is operable to compare the counter output signal with a first target, wherein the target is N+1. The second comparator 32 is operable to compare the counter output signal with the second target, which is N+2.

REFERENCE NUMBERS 5 processing unit
10 digital logic controller
11 signal input
12 clock source
14 delay cell
15 delay cell
16 delay cell
17 delay cell
18 counter
20 first logic unit
21 second logic unit
22 flip-flop
24 flip-flop output
30 comparator
31 AND gate
32 comparator
33 AND gate
34 comparator
35 AND gate
36 signal output
37 signal output
38 signal output

The invention claimed is:

1. A digital logic controller, to generate stable output signals comprising:
  a set of delay cells all connected in series and connectable to a signal input in input of a first delay cell,
  a counter connectable to the signal input via at least one of series connected delay cells,
  two logic units to generate reset signal by one of logic units and to generate set signal by the other of logic units, and connected between the set of delay cells and a flip-flop operable to generate a counter valid signal at a flip-flop output,
  at least one comparator connected to an output of the counter and operable to compare a counter output signal with a first target,
  at least one logic block connected to the flip-flop output and used to enable or disable the output of the comparator.

2. The digital logic controller according to claim 1, further comprising a clock source connected to the signal input.

3. The digital logic controller according to claim 1, wherein the logic block comprises a first input, a second input and an output, wherein the first input is connected to the flip-flop output, wherein the second input is connected to the output of the first comparator and wherein the logic block is operable to provide a filtered output signal at the output.

4. The digital logic controller according to claim 1, further comprising:
  a second comparator connected to the output of the counter and operable to compare the counter output signal with a second target,
  a second logic block connected to the flip-flop output, and connected to the output of the second comparator and operable to temporally deactivate processing of the counter output signal.

5. The digital logic controller according to claim 1, wherein the set of delay cells are all connected in series includes the first delay cell, a second delay cell, a third delay cell, and a fourth delay cell.

6. The digital logic controller according to claim 5, wherein an input of a second delay cell is connected to an output of the first delay cell, wherein an input of the third delay cell is connected to an output of the second delay cell and wherein an input of the fourth delay cell is connected to an output of the third delay cell.

7. The digital logic controller according to claim 6, wherein an input of the counter is connected to the output of the second delay cell.

8. The digital logic controller according to claim 6, wherein the first logic unit is connected to the first delay cell and connected to the flip-flop, and wherein the second logic unit is connected to the fourth delay cell and to the flip-flop.

9. The digital logic controller according to claim 8, wherein the first logic unit comprises a first input, a second input and an output, wherein the first input is connected to the signal input, wherein the second input is connected to an output of the first delay cell and wherein the first logic unit is operable to provide a reset signal for the flip-flop at the output.

10. The digital logic controller according to claim 8, wherein the second logic unit comprises a first input, a second input and an output, wherein the first input is connected to an output of the third delay cell, wherein the second input is connected to an output of the fourth delay cell and wherein the first logic unit is operable to provide a set signal for the flip-flop at the output.

11. The digital logic controller according to claim 1, wherein the counter and the flip-flop are operable to change a logic state with a falling edge of the clock source.

12. The digital logic controller according to claim 11, wherein generation of the counter valid signal at the flip-flop output is reset with a falling edge of the input signal while the first time delayed input signal is high.

13. The digital logic controller according to claim 11, wherein generation of the counter valid signal at the flip-flop output is set with a falling edge of the third time delayed input signal while the fourth time delayed input signal is high.

14. The digital logic controller according to claim 1, wherein the counter and the flip-flop are operable to change a logic state with a rising edge of the clock source.

15. The digital logic controller according to claim 14, wherein generation of the counter valid signal at the flip-flop output is reset with a rising edge of the input signal while the first time delayed input signal is low.

16. The digital logic controller according to claim 14, wherein generation of the counter valid signal at the flip-flop output is set with a rising edge of the third time delayed input signal while the fourth time delayed input signal is low.

* * * * *